United States Patent [19]

Lepselter

[11] 4,325,778
[45] Apr. 20, 1982

[54] HIGH CAPACITY ETCHING PROCESS

[75] Inventor: Martin P. Lepselter, Summit, N.J.

[73] Assignee: Bell Telephone Laboratories, Incorporated, Murray Hill, N.J.

[21] Appl. No.: 225,466

[22] Filed: Jan. 16, 1981

Related U.S. Application Data

[62] Division of Ser. No. 65,185, Aug. 9, 1979, Pat. No. 4,268,374.

[51] Int. Cl.³ .............................................. C23C 15/00
[52] U.S. Cl. ................................... 156/643; 156/646; 204/192 E
[58] Field of Search ....................... 156/643, 646, 345; 204/192 E, 192 EC, 298

[56] References Cited

U.S. PATENT DOCUMENTS

| | | | |
|---|---|---|---|
| 3,617,459 | 11/1971 | Logan | 204/298 |
| 3,617,463 | 11/1971 | Gregor et al. | 204/298 |
| 3,630,881 | 12/1971 | Wester et al. | 204/298 |
| 3,644,191 | 2/1972 | Matsushima | 204/298 |
| 3,707,452 | 12/1972 | Wester el al. | 204/192 R |
| 3,796,649 | 3/1974 | Lamont et al. | 204/298 |
| 3,856,654 | 12/1974 | George | 204/192 |
| 3,971,684 | 7/1976 | Muto | 204/192 E |
| 4,230,515 | 10/1980 | Zajac | 156/345 |
| 4,252,626 | 2/1981 | Wright et al. | 204/298 |

OTHER PUBLICATIONS

Mauer et al, "Mechanism . . . Plasma", J. Vac. Sci. Technology, vol. 15 (5), Sep./Oct. 1978, pp. 1734–1738.
George, "Cylindrical . . . Production", J. Vac. Sci. Technology, vol. 10 (2) Mar./Apr. 1973, pp. 393–399.
Schwatz, "Competitive . . . Plasma", J. of Electrochemical Society: Solid State Tech., vol. 126(3), Mar. 1979, pp. 464–469.

*Primary Examiner*—Jerome W. Massie
*Attorney, Agent, or Firm*—Lucian C. Canepa

[57] ABSTRACT

A high-throughput apparatus is utilized in a process for sputter etching or reactive sputter etching of wafers. The apparatus comprises a large-area electrode centrally disposed within a relatively small-area cylindrical electrode. Wafers to be etched are mounted on the inside surface of the cylindrical electrode. A source of a-c power is capacitively coupled to the cylindrical electrode and the center electrode is grounded. By establishing a suitable plasma within the apparatus, simultaneous anisotropic etching of multiple wafers can be achieved.

4 Claims, 4 Drawing Figures

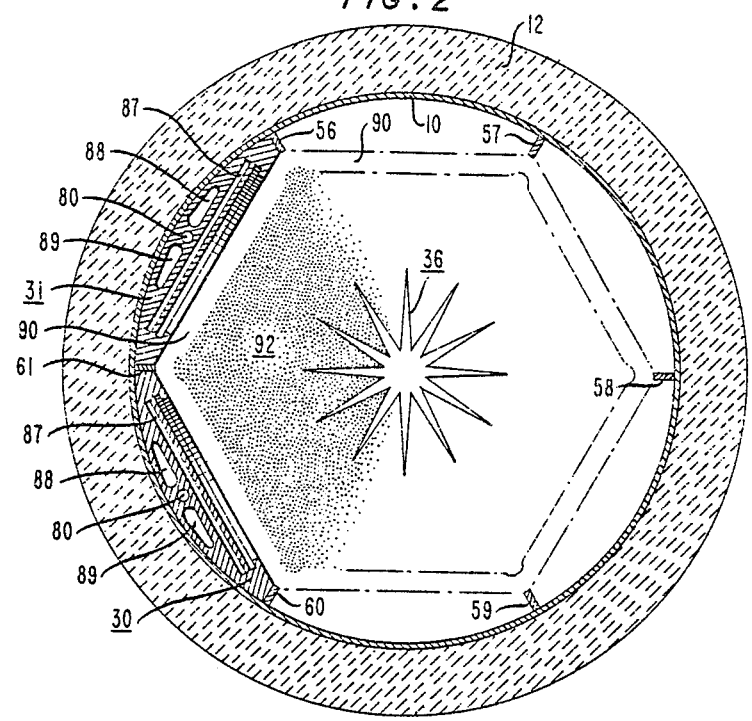
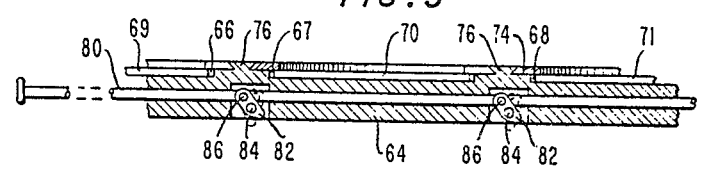
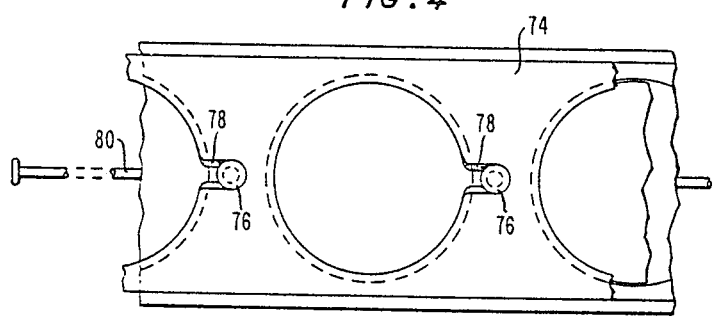

HIGH CAPACITY ETCHING PROCESS

This is a division of application Ser. No. 65,185, filed Aug. 9, 1979, now U.S. Pat. No. 4,268,374, issued May 19, 1981.

BACKGROUND OF THE INVENTION

This invention relates to high-precision patterning and, more particularly, to a process in which fine-line patterns are delineated by dry etching.

Considerable interest exists in employing dry processing techniques for patterning workpieces such as semiconductor wafers. The interest in dry processing techniques stems from their generally better resolution and improved dimensional and shape control capabilities relative to standard wet etching. Thus, dry etching is being utilized increasingly for, for example, pattern delineation in the processing of semiconductor wafers to form large-scale-integrated (LSI) devices.

Various dry etching processes that involve radio-frequency-generated plasmas are known. These processes include sputter etching which is described, for example, in *J. Vac. Sci. Technol.*, Vol. 13, No. 5, pp. 1008–1022, Sept./Oct. 1976, and reactive sputter etching which is described, for example, in *Proc. 6th Int'l. Vacuum Congr. 1974, Japan, J. Appl. Phys.*, suppl. 2, pt. 1, pp. 435–438, 1974.

Heretofore, so-called parallel-plate reactors have been utilized for sputter etching or reactive sputter etching of workpieces such as semiconductor wafers. In many cases of practical importance, however, it has been recognized that the throughput characteristics of available reactors have not been adequate for large-scale production of LSI devices. Accordingly, efforts have been directed at trying to devise high-throughput etching equipment that would be capable of simultaneously processing a relatively large number of workpieces. It was recognized that such equipment, if available, could substantially decrease the cost of devices processed therein.

SUMMARY OF THE INVENTION

Hence, an object of the present invention is an improved etching process. More specifically, an object of this invention is an etching process exhibiting a high-throughput characteristic.

Briefly, these and other objects of the present invention are realized in a specific illustrative etching process carried out in an apparatus that comprises a relatively large-area anode centrally positioned within a relatively small-area cylindrical cathode. Multiple members each capable of holding plural workpieces such as semiconductor wafers to be etched are mounted on the inner wall of the cathode. A source of radio-frequency (r-f) power is capacitively coupled to the cathode and the large-area anode is grounded. A gaseous atmosphere is established within the apparatus. In response to r-f excitation of the apparatus, a dark space is formed in the immediate vicinity of the mounted workpieces and a plasma is formed between the dark space and the anode. In such an embodiment, uniform high-throughput sputter etching or reactive sputter etching of workpieces can be carried out in a reliable and low-cost way.

BRIEF DESCRIPTION OF THE DRAWING

A complete understanding of the present invention and of the above and other features thereof may be gained from a consideration of the following detailed description presented hereinbelow in connection with the accompanying drawing, in which:

FIG. 2 is a sectional depiction of the apparatus viewed along the line 2 of FIG. 1;

and FIGS. 3 and 4 illustrate the manner in which workpieces are secured in place in the apparatus.

DETAILED DESCRIPTION

Figure 1:
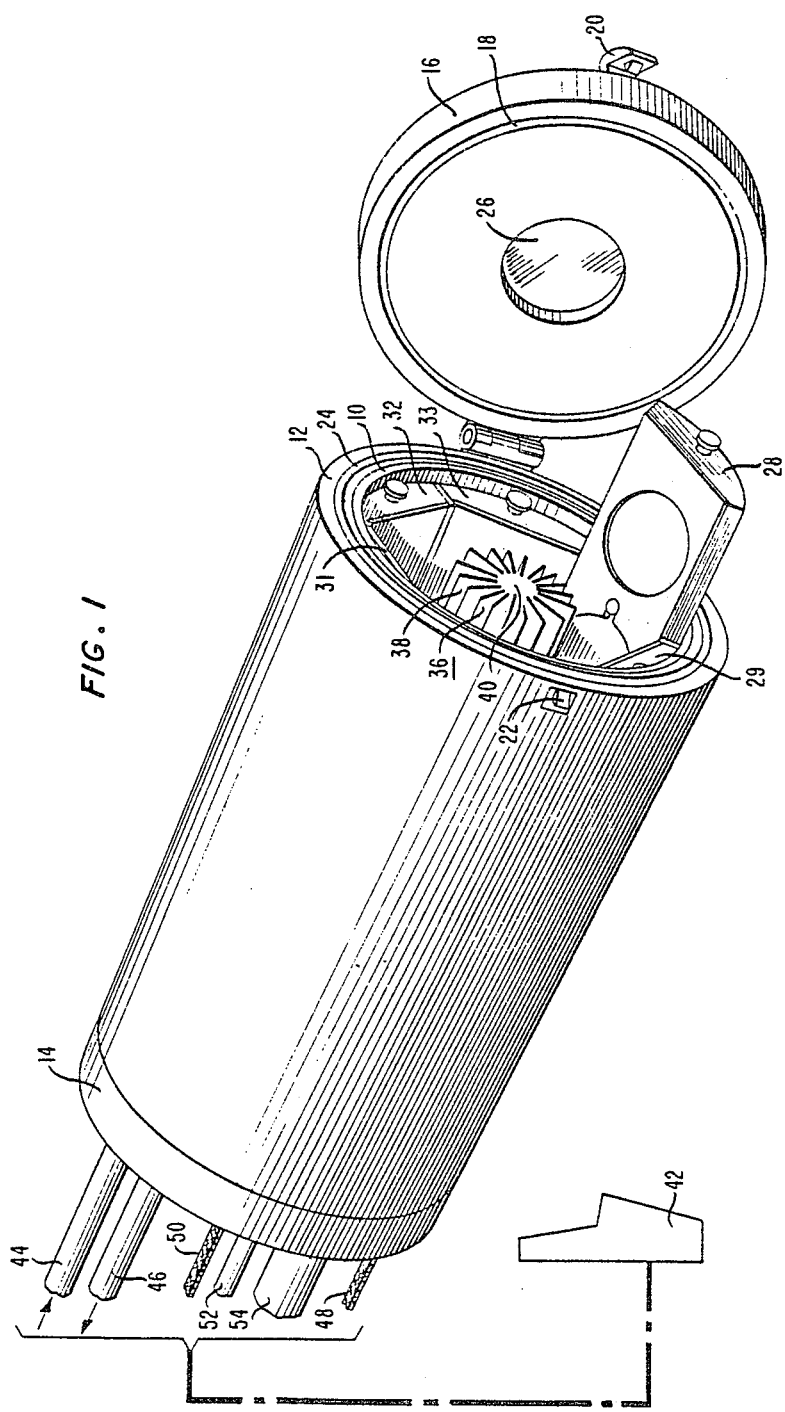
FIG. 1 shows a specific illustrative etching apparatus of the type utilized in carrying out an etching process in accordance with the principles of the present invention.

The specific illustrative etching apparatus shown in FIG. 1 comprises a cylindrical cathode element 10 made of an electrically conductive material such as, for example, aluminum or stainless steel. A nonconductive cylindrical cladding member 12 made, for example, of glass or ceramic envelops the element 10 and is securely bonded thereto. A disc 14 of such a nonconductive cladding material is utilized to seal the left-hand end of the cylindrical member 12. In turn, the right-hand end of the member 12 is, illustratively, sealed by means of a hinged loading door 16 which has affixed thereto a standard O-ring 18. When the door 16 is secured in its closed position by means of mating latching elements 20 and 22, the O-ring 18 fits in groove 24 formed in the right-hand flat end of the cylindrical member 12. If the door 16 is made of an optically opaque material, a sealed transparent viewing port 26 is advantageously included therein to permit observation of the sealed interior of the depicted apparatus during etching.

In accordance with the principles of the present invention, multiple workpieces to be etched are mounted in a symmetrical array on the inner surface of the cylindrical cathode element 10. By way of a specific example, the particular apparatus shown in FIG. 1 is designed to have six workpiece-retaining tray assemblies 28 through 33 mounted in contact with the inner surface of the element 10. When so mounted, the surface of each assembly faces toward the longitudinal axis of the cylindrical cathode element 10. Illustratively, each depicted tray assembly is adapted to retain six 6-inch wafers therein. The structure of the tray assemblies and the manner in which they are mounted in place in the depicted apparatus will be specified in detail later below.

The apparatus shown in FIG. 1 includes an anode element 36 centrally disposed with respect to the longitudinal axis of the cylindrical element 10. In accordance with the principles of the present invention, the anode-to-cathode surface area ratio is designed to exceed unity. Illustratively, this ratio is selected to be in the range 1.5 to 10. In one specific illustrative system of the type represented in FIG. 1, this ratio was designed to be approximately 2.6.

The relatively large-area anode element included in a cylindrical etching apparatus may be configured in a variety of ways. One specific illustrative such anode configuration is shown in FIG. 1. As indicated in FIG. 1, the anode element 36 comprises multiple longitudinally extending conductive vanes 38 emanating symmetrically from and physically supported by a longitudinally extending conductive core portion 40 which is centrally positioned on the longitudinal axis of the element 10. The vanes 38 and the core portion 40 are made, for example, of aluminum or stainless steel.

The area of the anode of the apparatus illustrated in FIG. 1 is the sum of the surface areas of the multiple vanes 38. The effective area of the cathode thereof is approximately the sum of the surface areas of the aforespecified faces of the workpiece-retaining tray assemblies 28 through 33.

The anode-to-cathode surface area ratio of a high-throughput etching apparatus of the type described herein is easily varied. This can be done, for example, by mounting the vanes 38 on the core portion 40 in any standard releasable way. Then, by changing the number and/or the areas of the respective vanes mounted on the portion 40, the anode-to-cathode surface area can be conveniently changed. In that way, operating conditions can be easily optimized to achieve specified etching characteristics.

The specific apparatus shown in FIG. 1 constitutes part of an etching system that also includes associated equipment 42 which is conventional in nature. The equipment 42 includes, for example, a vacuum system, gas sources, a high-frequency alternating-current (a-c) power supply adjustable to operate, for example, in the range 8 kHz to 50 mHz, a pumped source of cooling fluid, and associated standard controls and gauges by means of which specified operating conditions of the type set forth later below are established in the chamber 10. (Herein, for purposes of a specific illustrative example, capacitively coupled r-f excitation of the etching apparatus at a frequency of 13.5 mHz will be assumed.)

Illustratively, connections between the equipment 42 and the interior of the apparatus shown in FIG. 1 are made through the nonconductive disc 14. As schematically represented in FIG. 1, two fluid-carrying conduits, an inlet pipe 44 and an outlet pipe 46, extend between the equipment 42 and the etching apparatus. In a number of standard ways, fluid carried in the pipes 44 and 46 can be directed through the apparatus to cool wafers mounted therein for etching.

An a-c bus 48 and a reference-potential strap 50 are also indicated in FIG. 1 as extending between the equipment 42 and the depicted barrel reactor. In addition, a gas inlet pipe 52 and a conduit 54 extend therebetween. The pipe 52 is utilized to introduce a specified gas or mixture of gases into the etching apparatus. The conduit 54, which is connected to a standard vacuum pump in the equipment 42, serves to establish a prescribed low-pressure condition in the apparatus.

In accordance with the principles of the present invention, the aformentioned a-c bus 48 shown in FIG. 1 is coupled to the driven cathode element 10. Further, the strap 50, which is connected to a fixed point of reference potential such as electrical ground, is connected to the large-area anode element 36. In response to capacitively coupled a-c excitation of the elements 10 and 36 by the equipment 42, a generally symmetrical plasma and associated dark space are established in the apparatus in the space between the element 36 and the surfaces of multiple wafers mounted on the element 10, as will be specified in detail later below.

The previously described cathode and anode elements 10 and 36, respectively, and the cladding member 12 are also shown in the sectional view of FIG. 2. Also indicated in FIG. 2 are six longitudinally extending members 56 through 61 made, for example, of aluminum or stainless steel and affixed to the inner surface of the cathode element 10. The members 56 through 61 serve as retaining partitions for holding the aforementioned tray assemblies 28 through 33 in place. Illustratively, two such assemblies 30 and 31 are shown in FIG. 2. As shown, the assembly 30 is mounted between the retaining members 60 and 61, and the assembly 31 between the members 56 and 61, in contact with the inner surface of the cathode element 10. In a similar way, four other wafer-holding tray assemblies are designed to be mounted on the element 10 in the specific herein-considered apparatus.

Details of a specific illustrative tray assembly suitable for mounting on the element 10 are shown in FIGS. 3 and 4. As indicated in the sectional view of FIG. 3, the assembly includes a conductive base plate 64 made, for example, of aluminum. The bottom of the base plate 64 is shaped to match the contour of the inner surface of the element 10 (see FIG. 2). Six wafer-holding recesses are formed in the plate 64. Illustratively, these recesses are cylindrical and just slightly larger in diameter than the respective wafers designed to be placed therein. The depth of the recesses is approximately the same as the thickness of the wafers. Three such recesses 66 through 68, respectively having wafers 69 through 71 therein, are indicated in FIG. 3. A nonconductive top plate 74 (FIG. 4) made, for example, of fused silica (or of aluminum oxide, or of silicon, or comprising a dielectric material deposited on a metallic plate) is positioned on top of the base plate 64. The top plate 74 contains six apertures therethrough in aligned registry with the recesses in the base plate 64. The diameter of each aperture is slightly less than the diameter of the wafer contained in the recess immediately thereunder. Accordingly, the plate 74 serves to retain the workpieces to be etched in place in the base plate 64. A major portion of the top surface of each retained workpiece is thereby exposed through the respective aperture in the plate 74. When the wafer-containing assemblies are mounted in place on the inner surface of the cathode element 10, the exposed surfaces of the retained workpieces are positioned in place for etching in the apparatus described herein. When so positioned, the bottom surfaces of the workpieces are in electrical contact with the base plate 64 which, in turn, is in electrical contact with the element 10. Maintaining good electrical contact between the workpieces and the cathode in this manner has been determined to be particularly important when carrying out, for example, anisotropic etching of doped polysilicon.

One illustrative way in which to secure the top plate 74 in aligned registry with its associated base plate 64 is shown in FIGS. 3 and 4. Studs 76 formed at the top of the base plate 64 are designed to slide in grooves 78 in the top plate 74. When the top plate 74 is slid into position as shown in FIGS. 3 and 4, the studs 76 frictionally engage the plate 74 and hold it in a predesigned retaining orientation with respect to the wafers thereunder.

Illustratively, each tray assembly to be mounted on the inner wall of the cathode element 10 also includes a locking cam rod 80 (see FIGS. 3 and 4) that extends through a centrally positioned cam rod opening in the base plate 64. Additionally, as depicted in FIG. 3, plural locking cams 82 are rotatably mounted by pins 84 to the base plate 64 and by pins 86 to the cam rod 80. After a tray assembly is slid into position between two associated ones of the retaining members 56 through 61, the assembly is mechanically locked in place and established in good electrical contact with the element 10 by depressing the cam rod 80 (from left to right in FIGS. 3 and 4.)

Cooling of the workpieces mounted in the depicted etching apparatus is advantageous. Otherwise, heat generated during the etching process may cause material included on the workpiece to flow and thereby deleteriously alter the geometry of the device being fabricated. Moreover, by controlling the temperature of the workpieces to maintain a specified optimal temperature on the surfaces thereof, a relatively uniform and efficient etching action is achieved for materials whose etch rates are temperature dependent.

One specific illustrative way in which to cool the workpieces to be etched is shown in FIG. 2. Fluid-carrying channels 87 through 89 are formed in the base plate 64 of each tray assembly. (So as not to unduly clutter FIGS. 3 and 4, these channels are shown in FIG. 2 but not in FIGS. 3 and 4.) Fluid directed through the channels 87 and returned to the equipment 42 via the channels 88 and 89 is effective to maintain the surfaces to be etched at a specified temperature.

Illustratively, the channels 87 through 89 shown in FIG. 2 can be interconnected internally within the base plate 64 of each mounting assembly near the end that is adjacent to the loading door 16. Similarly, the fluid-carrying channels at the other end of each assembly can be interconnected with the pipes 44 and 46 (FIG. 1) via a conventional plug-in assembly and manifold.

In an apparatus adapted for carrying out an etching process in accordance with the principles of the present invention, a plasma of the type typically utilized in conventional sputter etching or reactive sputter etching is established in the sealed interior of the apparatus. In particular, a generally symmetrical dark space is formed in the vicinity of the workpieces and a plasma is formed between the dark space and the element 36.

In FIG. 2, a dark space 90 is schematically represented as existing in the immediate vicinity of the mounted workpieces. In turn, a radio-frequency-generated plasma 92 is shown as filling the entire space in the depicted apparatus between the dark space 90 and the anode element 36.

The specific illustrative apparatus described herein is adapted to simultaneously etch thirty-six workpieces. A number of particular examples of sputter etching or reactive sputter etching in the depicted apparatus are set forth below.

Various gases are suitable for introduction into the apparatus of FIG. 1 to carry out sputter etching therein. Thus, for example, substantially pure gases such as argon, helium, neon, nitrogen, xenon, krypton or mixtures thereof, or other gaseous atmospheres known in the art to be suitable for sputter etching, can be utilized for sputter etching in the depicted apparatus. In one particular illustrative example, a gold layer on each of multiple wafers was selectively sputter etched within the depicted apparatus using a titanium or tantalum masking layer in an atmosphere comprising 80 percent argon and 20 percent dry air by volume. In this example, the cathode element 10 was capacitively coupled to and driven by an r-f source operating at 13.5 megahertz to provide power at a density of approximately 0.3 watts per square centimeter at the surface of the layers to be etched. Etching of the gold layers occurred at a rate of about 500 Angstrom units per minute when the gas flow into the apparatus was approximately 5-to-20 cubic centimeters per minute and the pressure within the etching apparatus was established in the range 5-to-10 microns.

In an atmosphere of substantially pure argon and under operating conditions that were otherwise the same as those specified above for gold, multiple layers of permalloy were simultaneously sputter etched in the FIG. 1 apparatus at a rate of approximately 300 Angstrom units per minute.

Reactive sputter etching can be carried out in the FIG. 1 apparatus utilizing a variety of gases. Gases such as, for example, substantially pure oxygen, chlorine, $C_2F_6$, $CHF_3$, $DlF_3$, $BCl_3$, $SiF_4$, any one of the freon gases, or mixtures thereof, or mixtures of the aforespecified gases with helium, argon, nitrogen, neon, hydrogen, xenon or krypton, or other gaseous atmospheres known in the art to be suitable for reactive sputter etching, can be utilized for reactive sputter etching in the depicted apparatus. In one particular illustrative example, a thermally grown silicon dioxide layer on each of multiple wafers was selectively etched within the apparatus using a photoresist masking layer in an atmosphere comprising substantially pure $CHF_3$. In this example, the cathode element 10 was driven by an r-f source operating at 13.5 megahertz to provide power at a density of approximately 0.5 watts per square centimeter at the surface of the layers to be etched. Etching of the oxide layers occurred at a rate of about 500 Angstrom units per minute when the gas flow into the apparatus was approximately 5-to-50 cubic centimeters per minute and the pressure within the etching apparatus was established at about 5 microns.

Finally, it is to be understood that the abovedescribed arrangements and techniques are only illustrative of the principles of the present invention. In accordance with these principles, numerous modifications and alternatives may be devised by those skilled in the art without departing from the spirit and scope of the invention.

An alternative etching apparatus and process exhibiting a high-throughput characteristic are disclosed in a commonly assigned copending application designated Ser. No. 105,620.

I claim:

1. A uniform high-throughput dry etching process for delineating fine-line patterns in multiple workpieces simultaneously by sputter etching or reactive sputter etching in the space between a small-surface-area conductive cylindrical cathode element and a large-surface-area anode element centrally mounted within said cathode element, said process comprising the steps of
   mounting the workpieces to be etched on the inner surface of said cathode element in a symmetrical cylindrical array,
   establishing a predetermined gaseous atmosphere within said anode-to-cathode space,
   and capacitively coupling said cathode element to a source of a-c power and connecting said anode element to a point of reference potential to form a generally symmetrical annular dark space in the immediate vicinity of said workpieces and to form a generally symmetrical annular plasma between said dark space and said anode element, thereby to cause uniform etching of said multiple workpieces to occur.

2. A process as in claim 1 wherein during etching said workpieces are mounted in electrical contact with said cathode element.

3. A process as in claim 2 wherein during etching said workpieces are cooled to maintain the surfaces thereof at a substantially uniform specified temperature.

4. A process as in claim 1 wherein said gaseous atmosphere comprises a reactive gas, said power source operates at approximately 13.5 megahertz and the pressure within said anode-to-cathode space is established at approximately 5 microns.

* * * * *